(12) United States Patent
Xue et al.

(10) Patent No.: US 8,785,296 B2
(45) Date of Patent: Jul. 22, 2014

(54) PACKAGING METHOD WITH BACKSIDE WAFER DICING

(75) Inventors: Yan Xun Xue, Los Gatos, CA (US); Ping Huang, Songjiang (CN); Yueh-Se Ho, Sunnyvale, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 16 days.

(21) Appl. No.: 13/396,531

(22) Filed: Feb. 14, 2012

(65) Prior Publication Data
US 2013/0210215 A1     Aug. 15, 2013

(51) Int. Cl.
*H01L 21/46* (2006.01)
*H01L 21/00* (2006.01)

(52) U.S. Cl.
USPC .................. 438/459; 438/462; 438/464

(58) Field of Classification Search
None
See application file for complete search history.

(56) References Cited

U.S. PATENT DOCUMENTS

| | | | |
|---|---|---|---|
| 7,767,554 B2 * | 8/2010 | Arita et al. | 438/462 |
| 8,399,281 B1 * | 3/2013 | Patterson et al. | 438/68 |
| 8,642,448 B2 * | 2/2014 | Lei et al. | 438/463 |
| 2004/0161877 A1 * | 8/2004 | Nepomuceno et al. | 438/110 |
| 2008/0242052 A1 * | 10/2008 | Feng et al. | 438/459 |
| 2009/0314144 A1 * | 12/2009 | Iri | 83/13 |

* cited by examiner

*Primary Examiner* — Scott B Geyer
(74) *Attorney, Agent, or Firm* — CH Emily LLC

(57) ABSTRACT

A packaging method with backside wafer dicing includes the steps of forming a support structure at the front surface of the wafer then depositing a metal layer on a center area of the backside of the wafer after grinding the wafer backside to reduce the wafer thickness; detecting from the backside of the wafer sections of scribe lines formed in the front surface in the region between the edge of the metal layer and the edge of the wafer and cutting the wafer and the metal layer from the wafer backside along a straight line formed by extending a scribe line section detected from the wafer backside.

20 Claims, 8 Drawing Sheets

US 8,785,296 B2

PACKAGING METHOD WITH BACKSIDE WAFER DICING

FIELD OF THE INVENTION

The invention generally relates to a packaging method of an ultra-thin chip, particularly, the invention provides a packaging method supporting sawing the wafer from its backside.

BACKGROUND OF THE INVENTION

In semiconductor packaging technologies, the wafer is normally cut along a scribe line at the front surface of the wafer to separate individual chip packages from the wafer. However, in some special packaging technologies, for example, molded wafer level packaging (MWLP), the wafer is required to cut from its backside. However, if the backside of the wafer is sealed by molding materials or covered with non-transparent materials, sawing the wafer from its backside along the scribe line located at the front surface of the wafer becomes a big challenge.

U.S. Pat. No. 6,107,164 discloses a wafer level packaging method, which is shown in FIGS. 1A-1D. As shown in FIG. 1A, a wafer 10 includes semiconductor chips at its front surface and an electrode metal pad 2 connected to electrode bump 4 via a copper interconnection or wire 3. Groove 22 is formed between two adjacent semiconductor chips by cutting the wafer 10 via a blade 21 to a depth deeper than half of the thickness of the wafer 10. The front surface of the wafer 10 and the electrode bump 4 are covered with a layer of resin 23, as shown in FIG. 1B, with the resin 23 fully encapsulating the electrode bump 4. As shown in FIG. 1C, the resin 23 is then ground and polished by a polishing blade 24 until the electrode bump 4 is exposed from the resin 23. As shown in FIG. 1D, the wafer 10 is then ground at its backside until the groove 22 filled with the resin 23 is exposed at the backside of the wafer 10. Individual chip packages are separated by sawing the wafer 10 from its backside through the groove 22 using a dicing blade 26. However, it is preferable that the wafer sawing is performed by cutting through groove 22 at the front surface of the wafer 10 for a better alignment. Furthermore, the cutting groove 22 must be controlled to have a certain depth and the wafer 10 must be controllably thinned to a certain thickness to expose the groove 22. In addition, if the backside of the wafer is covered with molding materials, the groove 22 is thus covered with molding material, as such, the wafer dicing step, cutting the wafer through groove 22 via the dicing blade 26, is more challenging.

BRIEF DESCRIPTION OF THE DRAWINGS

As shown in attached drawing, the embodiment of the invention is more sufficiently described. However, the attached drawing is only used for explanation and illustration rather than limitation to the scope of the invention.

DETAILED DESCRIPTION OF THE EMBODIMENTS

Figure 1A:
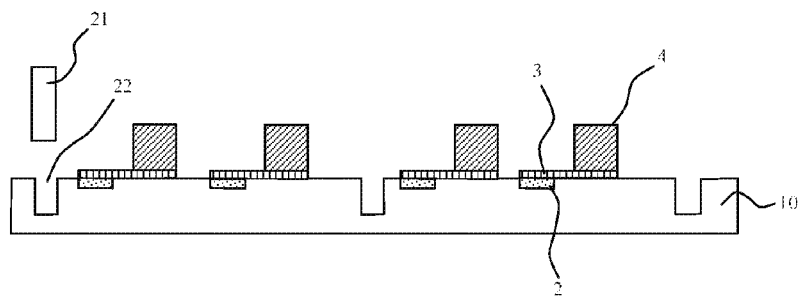
FIGS. 1A to 1D are cross-sectional views illustrating a wafer level packaging method of prior art.
Figure 1B:
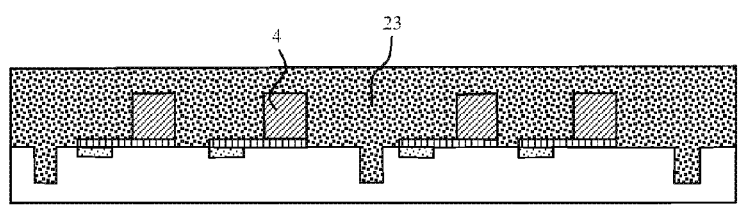
Figure 1C:
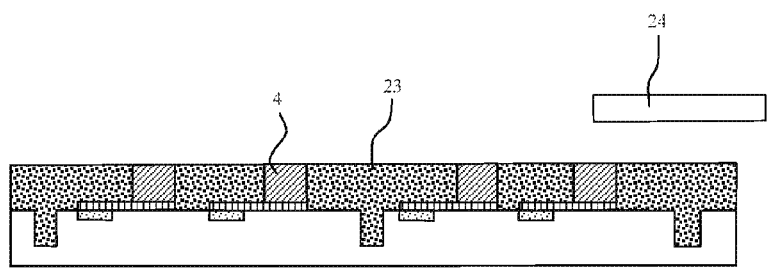
Figure 1D:
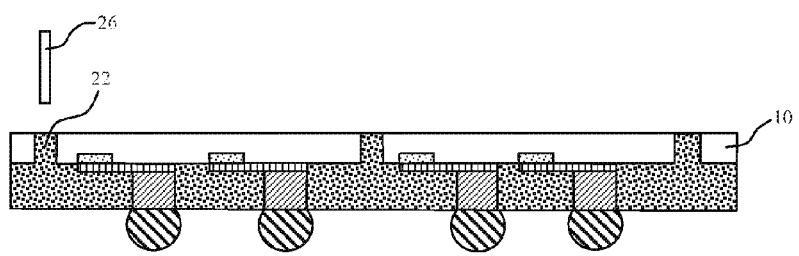
Figures 1, 2A:
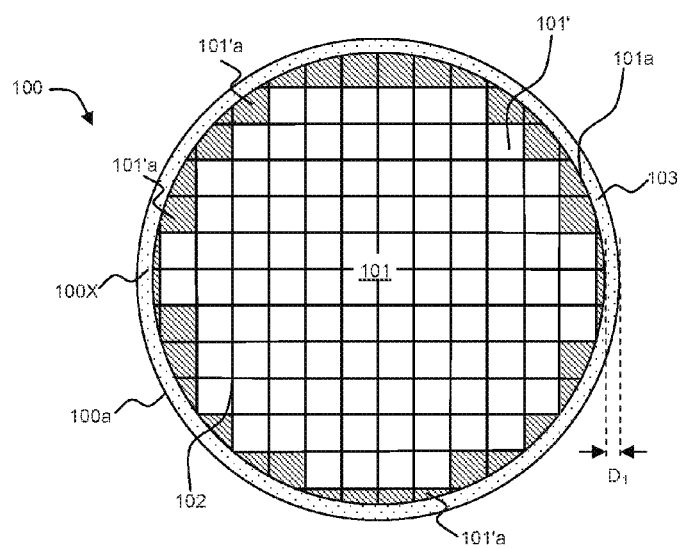
FIGS. 2A to 2E are the flow schematic diagrams of a packaging method with backside wafer dicing of the embodiment 1.
FIGS. 3A-1 to 3C are the flow schematic diagrams of a packaging method with backside wafer dicing of the embodiment 2.
Figures 2, 2A:
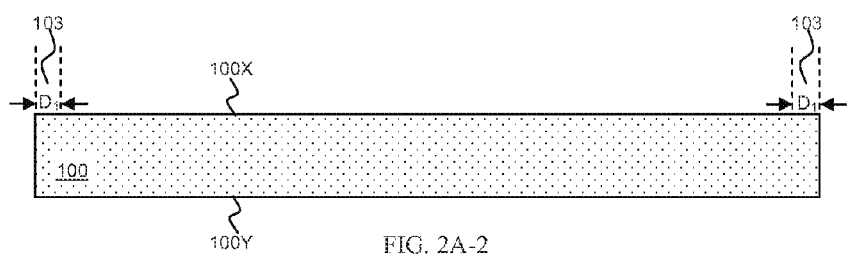

FIG. 2A-1 is a top view of the front surface 100X of a semiconductor wafer 100 and FIG. 2A-2 is a cross-sectional view of the wafer 100, which also shows the backside 100Y of the wafer 100. As shown in FIG. 2A-1, an active area 101 of the wafer 100 commonly comprises a plurality of semiconductor chips 101' and spaced apart by scribe lines 102 located at the front surface 100X of the wafer 100 and used for cutting the wafer 100 to separate the chips 101' from the wafer 100, which is well known in the art. As shown in FIG. 2A-1, the active area 101 is of round shape and is coaxial to the wafer 100 with the radius of the active area 101 being less than that of the wafer 100. It is well known in the art that integrated circuits are only formed on the chips within the active area 101 of the wafer. A region 103 is formed on the front surface 100X of the wafer 100 between the edge 101a of the active area 101 and the edge 100a of the wafer 100, which is a non-active area, i.e., without chips formed thereon. In addition, the scribe lines 102 located at the front surface of the wafer 100 are formed in the active area 101 and may extend into the region 103. Region 103 is used to transport the wafer 100, for example, carrying tools, gloves or hand grips of a processing equipment may contact the region 103 but not the active area 101 when transport the wafer to prevent the chip 101' from physical damage and static effect. The width $D_1$ of the region 103 is equal to the difference between the radius of the wafer 100 and the radius of the active area 101, preferably $D_1$ is approximately between 1.2 mm and 1.5 mm. It is well known in the art that some chips 101'a arranged in the active area 101, close to and contacting with the edge 101a, are not complete, as shown in shadow area in FIG. 2A-1, and after all chips 101' are separated from the wafer 100, the incomplete chips 101'a are discarded.

Figure 2B:
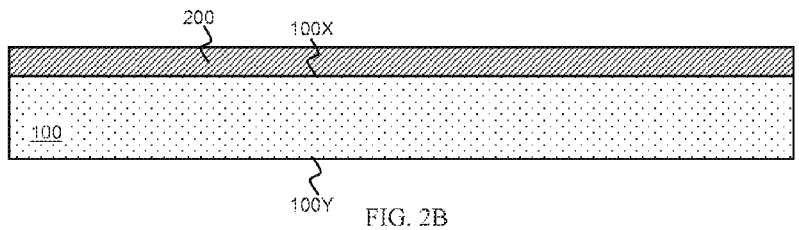
Figure 2C:
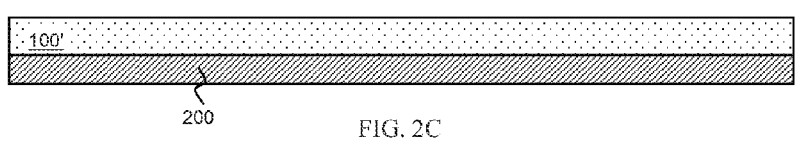

As shown in FIG. 2B, a layer of support structure 200 is formed at the front surface 100X of the wafer 100, which can be made of an adhesive membrane, plastic molding material or other proper support substrate. The support structure 200 supports the mechanical strength for the wafer 100 to prevent the crack in the wafer 100 once it is thinned to a certain thickness. As shown in FIG. 2C, the wafer 100 is ground at the backside 100Y to thin the wafer 100. In the grinding process, the wafer 100 is ground uniformly to obtain a uniform thickness.

Figures 1, 2D:
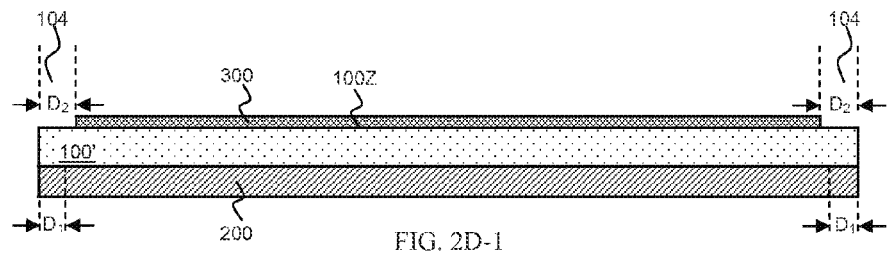
Figures 2, 2D:
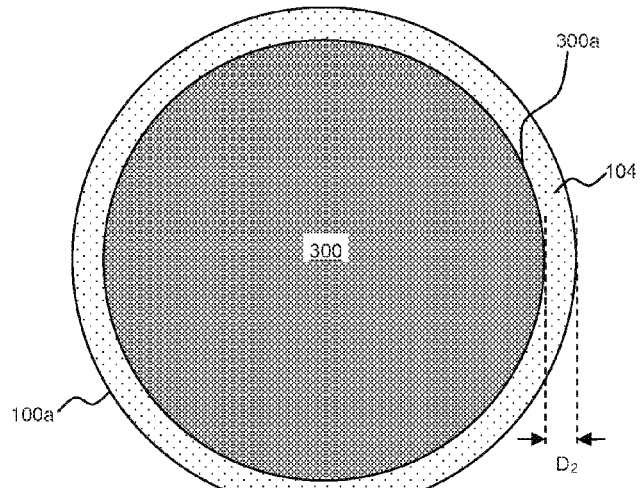

As shown in FIGS. 2D-1 and 2D-2, a metal layer 300 is deposited in the center portion of the backside 100Z of the thinned wafer 100'. In the process of forming the metal layer 300, the metal layer 300 is required to be approximately round shape and the radius of the metal layer 300 is less than that of the active area 101 with the metal layer 300 being concentric with the thinned wafer 100'. Optionally, after the wafer 100 is thinned, the backside 100Z of the thinned wafer 100' may be heavily doped with ions before the metal layer 300 is deposited to provide a good ohmic contact between the metal layer 300 and the backside 100Z of the thinned wafer 100'. In one prefer embodiment, the chip 101' is a vertical power metal-oxide-semiconductor field effect transistor (MOSFET). A ring 104 is formed in the region between the edge 300a of the metal layer 300 and the edge 100a of the wafer 100 (FIG. 2D-1) with the width $D_2$ of the ring 104 being equal to the difference between the radius of the wafer 100 and the radius (FIG. 2D-2) of the metal layer 300. $D_2$ is approximately 3 mm to 10 mm. As described above, the front 100X of the wafer 100' with the scribe line 102 is covered by the support structure 200. As such, it is difficult to carry out wafer dicing at the front surface of the wafer 100'. Therefore, the invention discloses a process for wafer dicing from the backside 100Z of the wafer 100', in which the metal layer 300 is cut into a plurality of metal electrodes located at the backside of each chip 101'. However, the backside 100Z of the wafer 100' is not provided with the scribe line for wafer dicing and the dicing blade cannot be accurately aligned with the scribe line 102 at the front 100X of the wafer 100' from the backside 100Z of the wafer 100'.

Figures 2, 2D, 3:
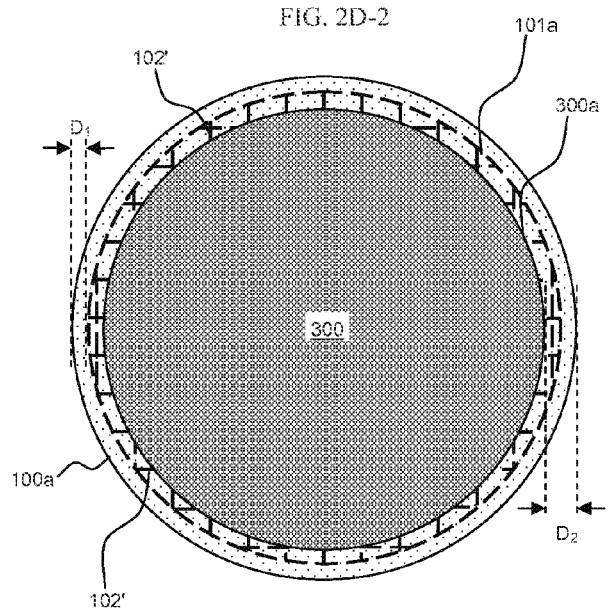

In some conventional alignment technologies, photographic equipment can be utilized for detecting the scribe line 102 at the front surface 100X of the wafer 100' from the backside 100Z of the wafer 100', for example, an infrared camera (IR camera). As shown in FIGS. 2D-1 to 2D-2, the IR camera cannot detect the scribe line 102 through the metal layer 300 but it can detect the scribe line sections 102 through thinned silicon wafer 100' at the ring 104. As shown in FIG. 2D-3, the scribe line 102 is detected at the ring 104 from the backside of the wafer while the part of the scribe line 102 beneath the metal layer 300 cannot be detected. The IR camera detects and captures an extending part 102' of the scribe line 102 extending from the edge 300a of the metal layer 300 to the edge 101a of the active area 101 inside the ring 104. A straight line (not shown) overlapping a corresponding scribe line 102 may be projected by linearly extending a detected scribe line section 102' in the ring area into the metal covering area to guide the wafer cutting process from the wafer backside. To maintain a high precision in determining the scribe lines from the wafer backside, it is necessary to have a long enough scribed line section 102' disposed in ring area. Preferably the scribe lines 102 would run to the wafer edge to maximize the length of scribe line sections 102' to be detected. In a preferred embodiment, the wafer is cut from the backside following a straight line overlapping with extensions of two separate scribe line sections detected from the wafer backside. When a straight line generated at the backside 100Z of the wafer 100' with two ends of the straight line being in line with two end sections 102' of one scribe line 102 detected in the ring area, the generated straight line is superimposed on the scribe lines 102. Then, the wafer dicing, via a dicing blade, can be carried out by cutting along the generated straight line. As mentioned above, the radius of the metal layer 300 must not be larger than that of the active area 101, otherwise, no scribe line sections 102' can be detected by the IR camera. When the area of the active area 101 is larger than that of the metal layer 300, the backside of the chips 101'a formed close to the edge 101a of the active area 101 is not completely covered by the metal layer 300, which cannot be used and have to be discarded.

Figure 2E:
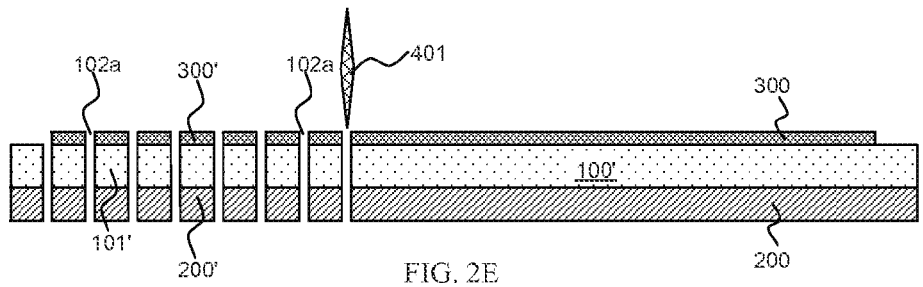

As shown in FIG. 2E, the IR camera is used to detect the scribe line 102 at the front surface 100X of the wafer 100' from the backside 100Z of the wafer 100', then the wafer 100' and the metal layer 300 are cut, via a first dicing blade 401, from the backside 100Z of the thinned wafer 100' along the straight line formed by two ends of a scribe line 102 detected in the extending part 102', forming groove 102a between two adjacent chips 101'. The cutting grooves 102a are used for cutting the wafer to separate the individual chips 101' from the wafer 100', and further used for cutting the metal layer 300 into a plurality of bottom metal layers 300', each of which is located at the backside of each chip 101'. Each groove 102a is corresponding to one scribe line 102. In an embodiment, as shown in FIG. 2E, the support structure 200 is made of a plastic packaging material, and the support structure 200 is cut into a plurality of top plastic package layers 200', each of which is located at the front surface of each chip 101' during the process of cutting the wafer 100' and the metal layer 300. In another embodiment (not shown), if the support structure 200 is a adhesive membrane, which is very thin, in the process of cutting the wafer 100' and the metal layer 300, the support structure 200 is not required to be cut through and thus the individual chips 101' are removed from the support structure 200.

Figures 1, 3A:
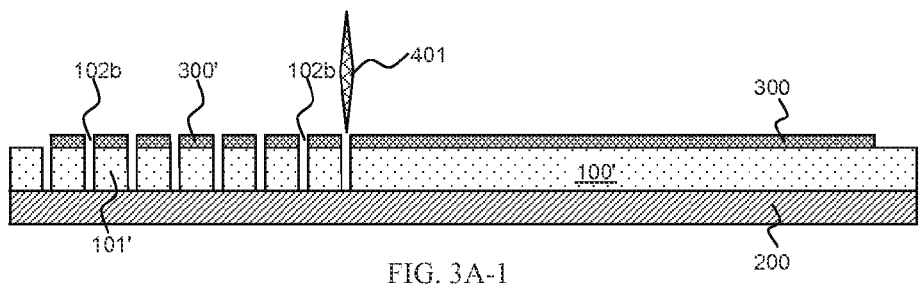
Figures 2, 3A:
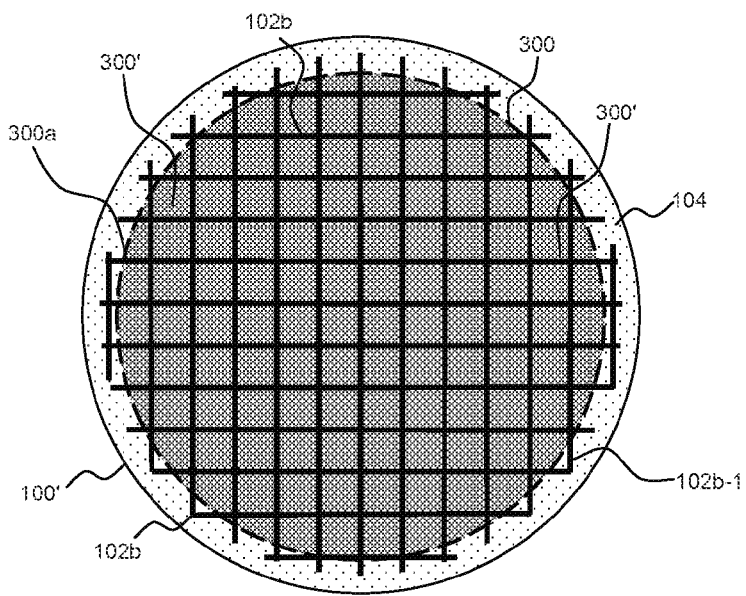
Figures 3, 3A:
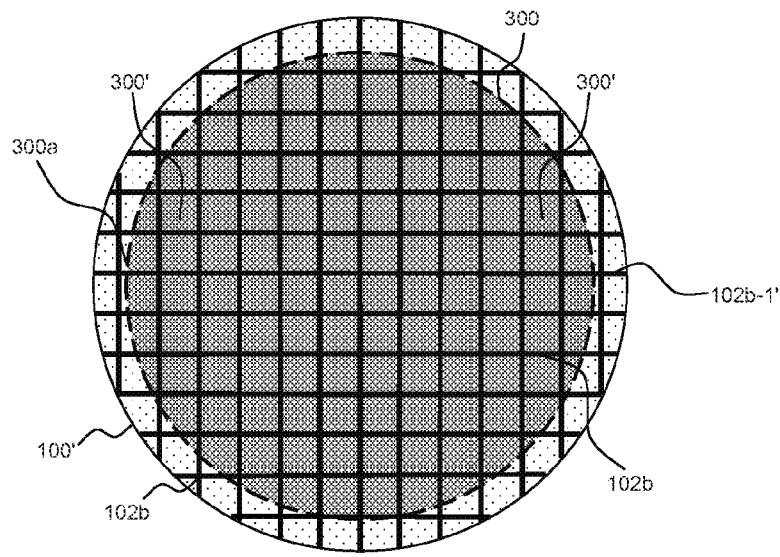
Figures 1, 3B:
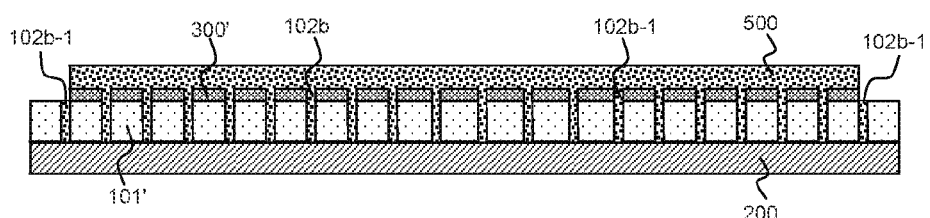
Figures 2, 3B:
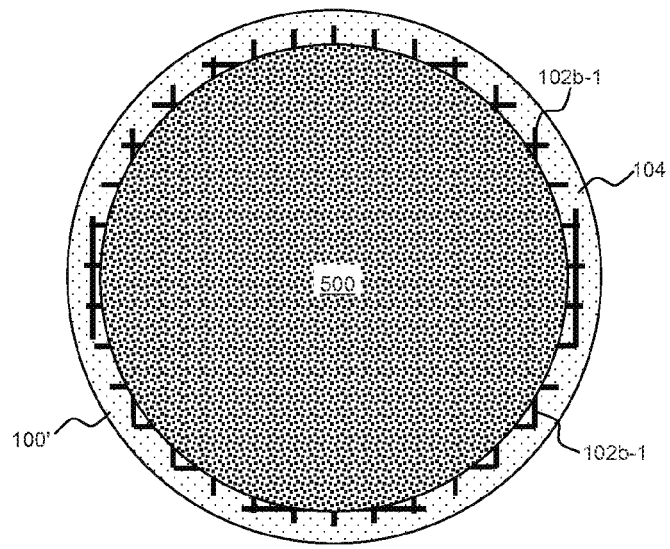
Figure 3C:
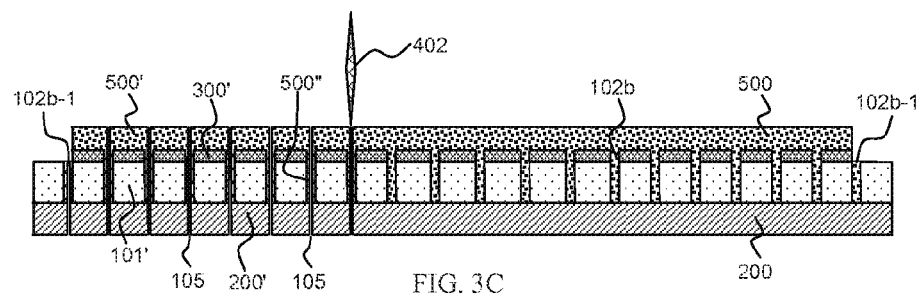

In one embodiment shown in FIGS. 3A-1 to 3C, the wafer 100' and the metal layer 300 are cut with the method shown in FIGS. 2A-1 to 2E, forming first cutting grooves 102b between two adjacent chips, and the metal layer 300 is cut into a plurality of bottom metal layers 300', each of which is located at the backside of each chip 101'. However, in this embodiment, the support structure 200 is not cut as shown in FIG. 3A-1. If the support structure 200 is adhesive membrane, it remains uncut during the cutting process of the wafer 100' and the metal layer 300. If the support structure 200 is made of the plastic packaging material, either it remains uncut during the cutting process of the wafer 100' and the metal layer 300 or it can be cut at the top portion, not the whole (not shown), with the first cutting groove 102b extending into the top portion of the support structure 200. As shown in FIG. 3A-2, the first cutting grooves 102b include an extending part 102b-1 formed inside the ring 104. As shown in FIG. 3B-1, the plastic packaging material is deposited to form a plastic package layer 500 covering on the metal layer 300, but not covering the ring 104, and filling in the first cutting grooves 102b. The plastic packaging material is filled into the first cutting groove 102b, therefore, the two ends of the first cutting groove 102b, also the extending part 120b-1, are required not to extend to the edge 100a of the wafer 100', as shown in FIG. 3A-2, to avoid the overflow of the plastic packaging material in liquid state before solidifying from the two ends of the cutting groove 102b to the outside of the wafer 100'. For example, shown in FIG. 3A-3, the cutting groove extending part 102b-1' is extended to the edge 100a, so the plastic packaging material is overflowed from the extending part 102b-1. As such, after solidifying, the overflowed plastic packaging material on the wafer 100' sticks to the packaging equipment, thus the wafer 100' is easy to break when remove the wafer from the packaging equipment. In this case, to avoid the overflow of the plastic packaging material in liquid state, a mold (or a chase) is used to block the edge 100a from the deposition of the plastic packaging material (not shown).

In another embodiment, as shown in FIGS. 3B-2 and 3C, the plastic packaging material filled into the extending parts 102b-1 at the two ends of the first cutting groove 102b forms a straight line. A second dicing blade 402 is utilized for cutting through the plastic package layer 500 along the center of the first cutting groove 102b and through the support substrate 200 along the straight line, forming the second cutting groove 105 within the first cutting groove 102b. After the cutting process, the plastic package layer 500 is cut into a plurality of bottom plastic package layers 500', each of which covers the bottom metal layer 300' of each chip. If the support structure 200 is made of the plastic packaging material, it is cut into a plurality of top plastic package layers 200', each of which is located at the front surface of each chip 101'. If the support structure 200 is an adhesive membrane, the support structure 200 is not required to be cut through. If the width of the second dicing blade 402 is narrower than that of the first dicing blade 401, the width of the second cutting groove 105 is narrower than that of the first cutting groove 102b. As such, the plastic packaging material filled in the first cutting groove 102b is cut, by the second dicing blade 402, into plastic package layer 500" covering the side wall of the chip 101'. If the second dicing blade 402 has the same width as the first dicing blade 401, the second dicing blade 402 exactly cuts off all the plastic packaging material filled in the first cutting groove 102b, therefore, the sidewall of the chip 101' is exposed and not covered by plastic packaging layer.

Figure 4A:
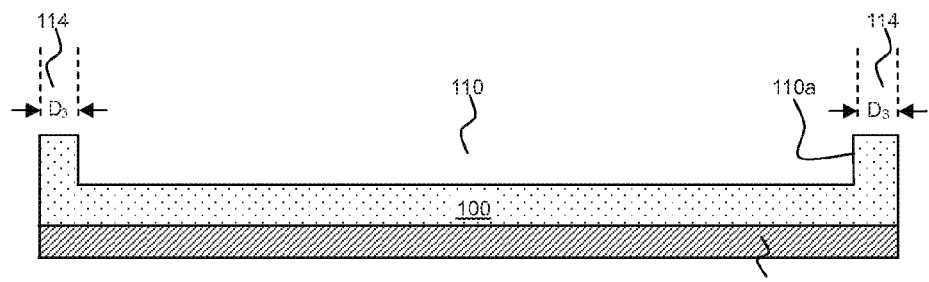
FIGS. 4A to 4C are the flow schematic diagrams of a packaging method with backside wafer dicing of the embodiment 3.
Figures 1, 4B:
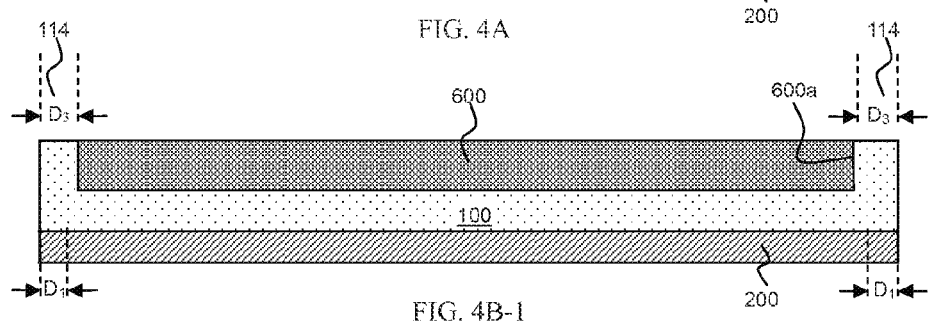
Figures 2, 4B:
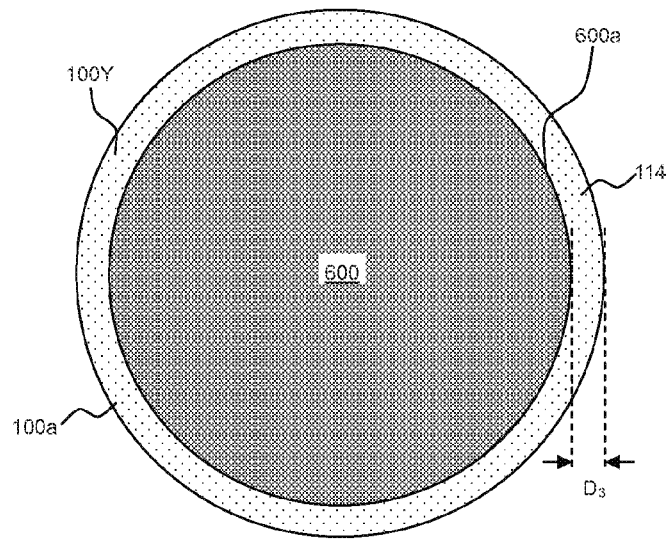
Figures 3, 4B:
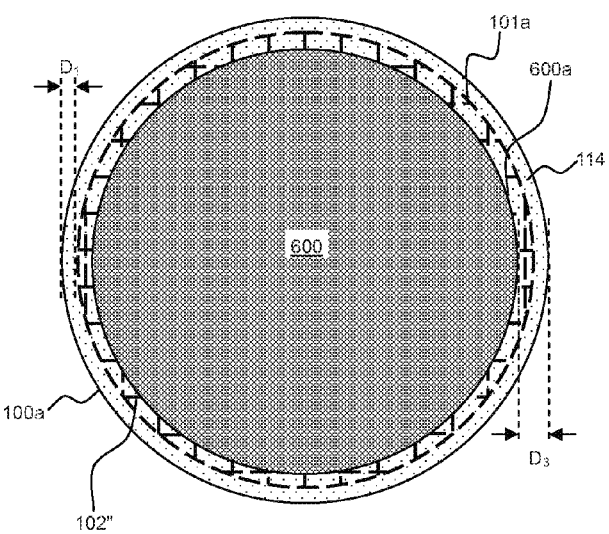
Figure 4C:
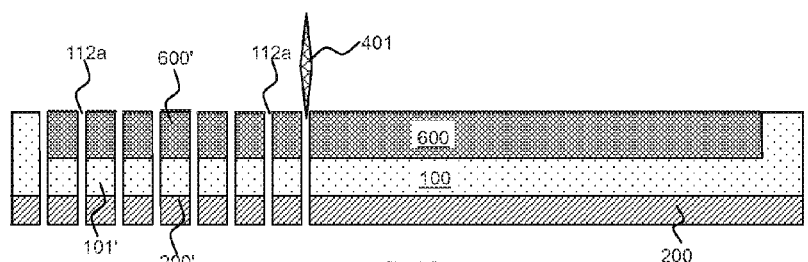

In another embodiment, as shown in a process flow of FIG. 4A-4C, the wafer 100 with the support structure 200 is thinned by grinding at a central portion of the backside 100Y of the wafer 100 with a grinding wheel (not shown) having a radius smaller than that of the wafer 100, thus forming a cavity 110 in the centre of the backside 100Y of the wafer 100, which has a round shape and coaxial to the wafer 100. The radius of the cavity 110 is smaller than that of the active area 101. The radius of the cavity 110 is adjusted via adjusting the size of the grinding wheel such that the side wall 110a of the cavity 110 is located above the incomplete chips 101'a in the active area 101 close to the edge 101a. The region of the backside 100Y of the wafer 100 located between the side wall 110a of the cavity 110 and the edge 100a of the wafer 100 forms the ring 114 (as shown in FIG. 4B-2). The width $D_3$ of the ring 114 is equal to the difference between the radius of the wafer 100 and that of the cavity 110, preferably $D_3$ is greater than $D_1$ and approximately 3 mm to 10 mm.

It is well known in the art that the thinner the wafer is, the easier the wafer warps and smashes. In this embodiment, compared with the method as shown in FIG. 2C, the ring 114 supports the thinned wafer 100 to eliminate the warp or smash in the wafer even if the centre of the backside 100Y of the wafer 100 is ground very thin. After the centre of the backside 100Y of the wafer 100 is thinned, a metal layer 600 is deposited on the bottom of the cavity 110. The thickness of the deposited metal layer 600 is approximately the same as the depth of the cavity 110, therefore the top surface of metal layer 600 is roughly co-planar with the backside 100Y of wafer 100 with the radius of the metal layer 600 is equal to that of the cavity 110. As described above, a photographic equipment, such as an IR camera, is utilized for detecting the scribe line 102 at the front 100X of the wafer 100 from the backside 100Y of the wafer 100. As shown in FIG. 4B-3, the infrared light cannot penetrate through the metal layer 600 but can penetrate through silicon in the ring 114. As a result, the IR camera (not shown) detects the scribe line 102 inside the ring 114, i.e., detects an extending scribe line section 102" of the scribe line 102 extending from the edge 600a of the metal layer to the edge 101a of the active area 101 of wafer 100, but the IR camera cannot detect the part of the scribe line 102 located below the metal layer 600. As described above, one straight line overlapping a corresponding scribe line 102 may be projected by linearly extending a detected scribe line section 102" in the ring area into the metal covering area to guide the wafer cutting process from the wafer backside. To maintain a high precision in determining the scribe lines from the wafer backside, it is necessary to have a long enough scribed line section 102" disposed in ring area. Preferably the scribe lines 102 would run to the wafer edge to maximize the length of scribe line sections 102" to be detected. In a preferred embodiment, the wafer is cut from the backside following a straight line overlapping with extensions of two separate scribe line sections detected from the wafer backside. When a straight line generated at the backside of the wafer 100 in line with the extending scribe line section 102" at the two ends of a scribe line 102 detected and positioned by the IR camera, the straight line is superimposed on the scribe line. As shown in FIGS. 4B-3 to 4C, the first dicing blade 401 is utilized for cutting the wafer 100 and the metal layer 600 along the straight line formed by the extending scribe line section 102" at two ends of any one of scribe lines 102 to separate a plurality of chips 101' from the wafer 100. A plurality of cutting grooves 112a in the wafer 100 are formed at a plurality of scribe lines 102 to separate individual chips 101' from each other. The metal layer 600 is cut into a plurality of bottom metal layers 600', each of which is located at the backside of each chip 101'. In one embodiment, as shown in FIG. 4C, if the support structure 200 is made of the plastic packaging material, the support structure 200 is cut to form a plurality top plastic package layers 200', each of which is located at the front of each chip 101'. In another embodiment (not shown), as mentioned above, if the support structure 200 is an adhesive membrane, the support structure is unnecessary to be cut.

Figure 5A:
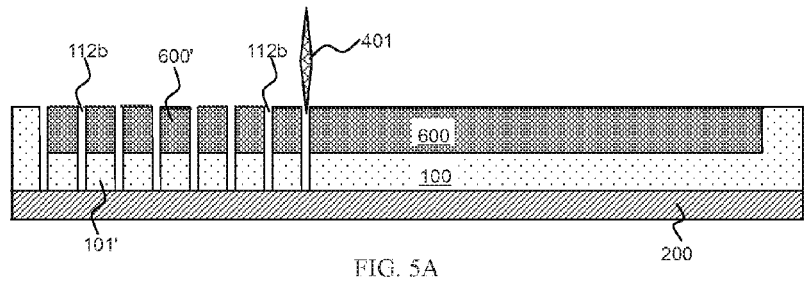
FIGS. 5A to 5C are the flow schematic diagrams of a packaging method with backside wafer dicing of the embodiment 4.
Figure 5B:
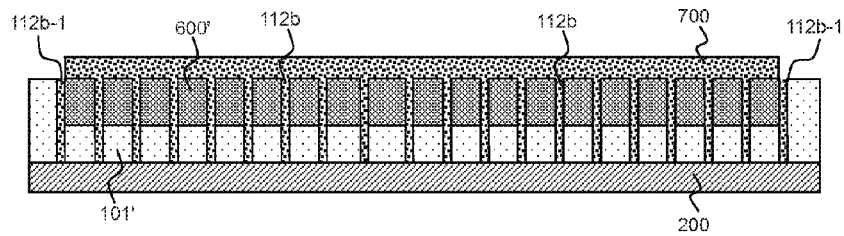
Figure 5C:
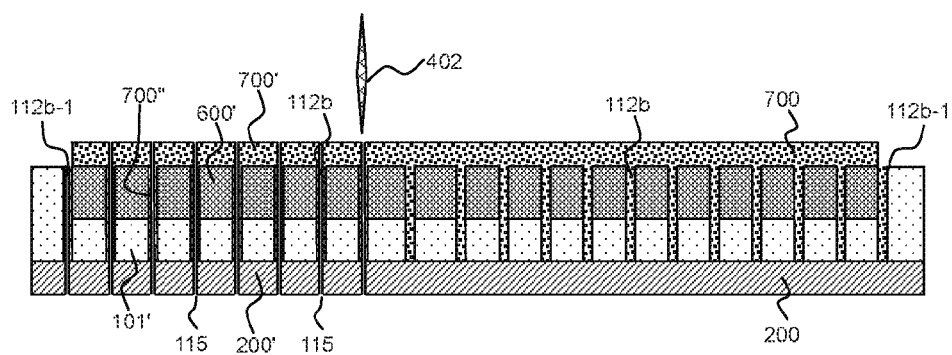

In one embodiment as shown in FIGS. 5A to 5C, firstly, the wafer 100 and the metal layer 600 are cut with the method as shown in FIGS. 4A to 4B-3, then a plurality of first cutting grooves 112b are formed by cutting the wafer 100 and the metal layer 600 via the first dicing blade 401. Similar to the method as shown in FIGS. 3A-1 to 3C, the support structure 200 can be either an adhesive membrane or made of plastic packaging material. The cutting groove 112b includes the cutting groove extending part 112b-1 formed inside the ring 114 in the active area 101. A plastic packaging material is then deposited to cover on the metal layer 600, without cover the ring 114, and fill in the cutting groove 112b forming a plastic package layer 700 as shown in FIG. 5B. Similarly, two ends of the cutting groove 112b are controlled not to extend to the edge 100a of the wafer 100, i.e., the cutting groove extending part 112b-1 is not close to the edge 100a of the wafer 100. Comparing the wafer 100 in FIG. 5B with the wafer 100' in FIG. 3B-1, if thicknesses of the thinned wafer 100 and the thinned wafer 100' are the same, the depth of the cutting groove extending part 112b-1 as shown in FIG. 5B is different from that of the cutting groove extending part 102b-1 as shown in FIG. 3B-1 because portion of the wafer 100 at the ring 114 is not ground. Similarly as described above, one straight line is formed by the plastic packaging material filled in the extending parts 112b-1 at the two ends of a cutting groove 112b. The plastic package layer 700 and the plastic packaging material filled into the cutting groove 112b are cut by a second dicing blade 402 along each straight line formed by the plastic packaging material filled into the extending parts 112b-1 at the two ends of each cutting grooves 112b forming second cutting groove 115. Furthermore, in the cutting process, the plastic package layer 700 is cut into a plurality of bottom plastic package layers 700', each of which covers each bottom metal layer 600' of each chip 101'. If the support structure 200 is made of plastic packaging material, it is cut to form a plurality of top plastic package layers 200', each of which is located at the front surface of each chip 101'. If the support structure 200 is an adhesive membrane, the support structure 200 is unnecessary to be cut. In addition, if the blade width of the second dicing blade 402 is narrower than that of the first dicing blade 401, the width of the cutting groove 115 is narrower than that of the cutting groove 102b. As a result, the plastic packaging material in the cutting groove 112b is cut into sidewall plastic package layers 700" covering sidewalls of the chip 101'. If the second dicing blade 402 has the same width as that of the first dicing blade 401, the sidewall of the chip 101' is not covered with any plastic package material.

The invention claimed is:

1. A packaging method with backside wafer dicing, wherein an active area of a semiconductor wafer comprises multiple semiconductor chips spaced-apart by scribe lines located at a front surface of the wafer, the method comprises the steps of:

forming a support structure at the front surface of the wafer;

grinding a backside opposite the front surface of the wafer to reduce a thickness of the wafer;

depositing a metal layer on a centre area of the backside of the wafer after grinding, wherein a radius of the metal layer is less than a radius of the active area, thus forming a ring of bare wafer in the region between the edge of the metal layer and the edge of the wafer, wherein each scribe line in the front surface extending at least from a projection of the edge of the metal layer to the edge of the active area;

detecting the scribe lines from the backside of the wafer; and cutting the wafer and the metal layer from the wafer backside along a straight line formed by extending a scribe line section detected from the wafer backside.

2. The method of claim 1, wherein the support structure comprises a plastic molding material, and wherein the step of cutting the wafer and the metal layer further cutting the plastic molding material forming a top plastic package layer at the front surface of each chip.

3. The method of claim 1, wherein the support structure comprises an adhesive membrane.

4. The method of claim 1, wherein the step of grinding the wafer backside grinds the entire wafer backside to a uniform thickness thin wafer.

5. The method of claim 1, wherein the process of cutting the wafer and the metal layer from the wafer backside further comprising a step of cutting the wafer and the metal layer from the wafer backside along a straight line overlapping with extensions of two separate scribe line sections detected from the wafer backside.

6. The method of claim 1, wherein the step of cutting the wafer and the metal layer further comprising a step of providing a plurality of first cutting grooves separating each of the multiple chips with a portion of the metal layer located at the backside of each chip; the method further comprising:

forming a plastic molding layer covering the metal layer and filling into the first cutting grooves;

cutting the plastic molding layer from the wafer backside along a center of each of the first cutting groove forming a second cutting groove within each of the first cutting groove separating each of the multiple chips with a backside plastic package layer formed of a portion of the plastic molding layer covering the metal layer of each chip.

7. The method of claim 6, wherein the support structure comprises plastic molding material and is cut into a plurality of top plastic package layers each located at the front surface of each chip.

8. The method of claim 6, wherein the support structure comprises an adhesive membrane.

9. The method of claim 6, wherein a width of the second cutting grooves is narrower than that of the first cutting grooves, wherein a residue of the plastic molding material in the first cutting grooves covering the sidewalls of the chips.

10. The method of claim 6, wherein a width of the second cutting grooves is the same as that of the first cutting grooves.

11. A packaging method with backside wafer dicing, wherein an active area of the wafer comprises a plurality of semiconductor chips spaced-apart by scribe lines located at a front surface of the wafer, the method comprises the steps of:

forming a support structure at the front surface of the wafer;

grinding a centre portion of a backside opposite the front surface of the wafer to form a cavity having a radius less than that of the active area of the wafer, wherein a ring is formed at the backside of the wafer in the region between the side wall of the cavity and the edge of the wafer;

depositing a metal layer on a bottom of the cavity, wherein each scribe line in the front surface extending at least from a projection of the edge of the metal layer to the edge of the active area;

detecting the scribe lines from the backside of the wafer; and cutting the wafer and the metal layer from the wafer backside along a straight line formed by extending a scribe line section detected from the wafer backside.

12. The method of claim 11, wherein the support structure comprises a plastic molding material, and wherein the step of cutting the wafer and the metal layer further cutting the plastic molding material forming a top plastic package layer at the front surface of each chip.

13. The method of claim 11, wherein the support structure comprises an adhesive membrane.

14. The method of claim 11, wherein a thickness of the metal layer deposited on the bottom of the cavity is substantially the same as the depth of the cavity.

15. The method of claim 11, wherein the process of cutting the wafer and the metal layer from the wafer backside further comprising a step of cutting the wafer and the metal layer from the wafer backside along a straight line overlapping with extensions of two separate scribe line sections detected from the wafer backside.

16. The method of claim 11, wherein the step of cutting the wafer and the metal layer further comprising a step of providing a plurality of first cutting grooves separating each of the multiple chips with a portion of the metal layer located at the backside of each chip; the method further comprising:

forming a plastic molding layer covering the metal layer and filling into the first cutting grooves;

cutting the plastic molding layer from the wafer backside along a center of each of the first cutting groove forming a second cutting groove within each of the first cutting groove separating each of the multiple chips with a backside plastic package layer formed of a portion of the plastic molding layer covering the metal layer of each chip.

17. The method of claim 16, wherein the support structure comprises plastic molding material and is cut into a plurality of top plastic package layers each located at the front surface of each chip.

18. The method of claim 16, wherein the support structure comprises an adhesive membrane.

19. The method of claim 16, wherein a width of the second cutting grooves is narrower than that of the first cutting grooves, wherein a residue of the plastic molding material in the first cutting grooves covering the sidewalls of the chips.

20. The method of claim 16, wherein a width of the second cutting grooves is the same as that of the first cutting grooves.

\* \* \* \* \*